(12) United States Patent
LeCheminant et al.

(10) Patent No.: US 6,577,964 B1
(45) Date of Patent: Jun. 10, 2003

(54) APPARATUS AND METHOD FOR DETERMINING COMPLIANCE MARGIN OF A WAVEFORM RELATIVE TO A STANDARD

(75) Inventors: Greg Davis LeCheminant, Santa Rosa, CA (US); Michael G Hart, Healdsburg, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 363 days.

(21) Appl. No.: 09/605,579

(22) Filed: Jun. 28, 2000

(51) Int. Cl.[7] .............................................. G01R 13/00
(52) U.S. Cl. ........................ 702/69; 702/71; 375/224; 324/121 R
(58) Field of Search ........ 702/66–77; 324/76.11–76.83, 324/121 R

(56) References Cited

U.S. PATENT DOCUMENTS 5,333,147 A * 7/1994 Nohara et al. ............... 375/224
5,491,722 A * 2/1996 Jones et al. .................. 375/224

OTHER PUBLICATIONS

Tektronix Application Note, "Physical Layer Testing of Data Communications Signals", 1998.*

* cited by examiner

Primary Examiner—Marc S. Hoff
Assistant Examiner—Andrew Morris
(74) Attorney, Agent, or Firm—John L. Imperato

(57) ABSTRACT

Compliance margin of a waveform is determined relative to a standard, indicating the extent to which the waveform either complies or fails to comply with the standard. An acquisition system captures the waveform of an applied signal in a display space, and a memory stores a representation of a series of scaled masks in the display space. Each scaled mask in the series is a version of the standard that is scaled relative to the standard according to a corresponding scale factor. A comparator determines which scaled masks in the series coincide with the waveform at one or more predesignated locations in the display space by comparing the waveform to the represented series of scaled masks at the one or more locations. An output device indicates the compliance margin of the waveform based on the corresponding scale factors of the scaled masks that coincide with the waveform at the one or more locations in the display space.

10 Claims, 4 Drawing Sheets

APPARATUS AND METHOD FOR DETERMINING COMPLIANCE MARGIN OF A WAVEFORM RELATIVE TO A STANDARD

BACKGROUND OF THE INVENTION

When monitoring or measuring signals, waveforms that represent the signals are typically compared to a standard, or specification limit, to establish whether or not the signals comply with the standard. For example, An eye diagram, which represents the waveform of a multi-valued signal, is compared to a mask that is defined by a standard. By superimposing the mask on the eye diagram it can be determined whether or not features of the waveform, such as one and zero levels, crossing time, and crossing level violate the mask and fail to comply with the standard. A mask violation occurs when any portion of the eye diagram falls either on, or within, the perimeter of the mask. Compliance with a designated standard is indicated by an absence of mask violations, whereas non-compliance with the standard is indicated by one or more mask violations. However, when monitoring or measuring signals there is a need to determine not only whether or not a waveform complies with a standard, but to determine also by what margin the waveform complies or fails to comply with that standard.

SUMMARY OF THE INVENTION

An apparatus and method constructed according to the preferred embodiments of the present invention determine the compliance margin of a waveform relative to a standard. The compliance margin indicates the extent to which the waveform either complies or fails to comply with the standard. The apparatus constructed according to the first preferred embodiment of the present invention includes an acquisition system that captures the waveform of an applied signal in a display space, and a memory that stores a representation of a series of scaled masks in the display space. Each scaled mask in the series is a version of the standard that is scaled relative to the standard according to a corresponding scale factor. A comparator determines which scaled masks in the series coincide with the waveform at one or more predesignated locations in the display space by comparing the wave to the represented series of scaled masks at the one or more locations. An output device indicates the compliance margin of the waveform based on the corresponding scale factors of the scaled masks that coincide with the waveform at the one or more locations in the display space.

The method constructed according to the second preferred embodiment of the present invention includes representing a series of scaled masks in the display space of a waveform wherein each scaled mask is a version of the standard that is scaled relative to the standard according to a corresponding scale factor. At one or more predesignated locations in the display space, the waveform is compared to the represented series of scaled masks to determine which of the scaled masks coincides with the waveform at the one or more locations. The compliance margin of the waveform is designated based on the corresponding scale factors of the scaled masks that coincide with the waveform at the one or more locations in the display space.

DETAILED DESCRIPTION OF THE PREFERRED EMBODIMENT

Figure 1:
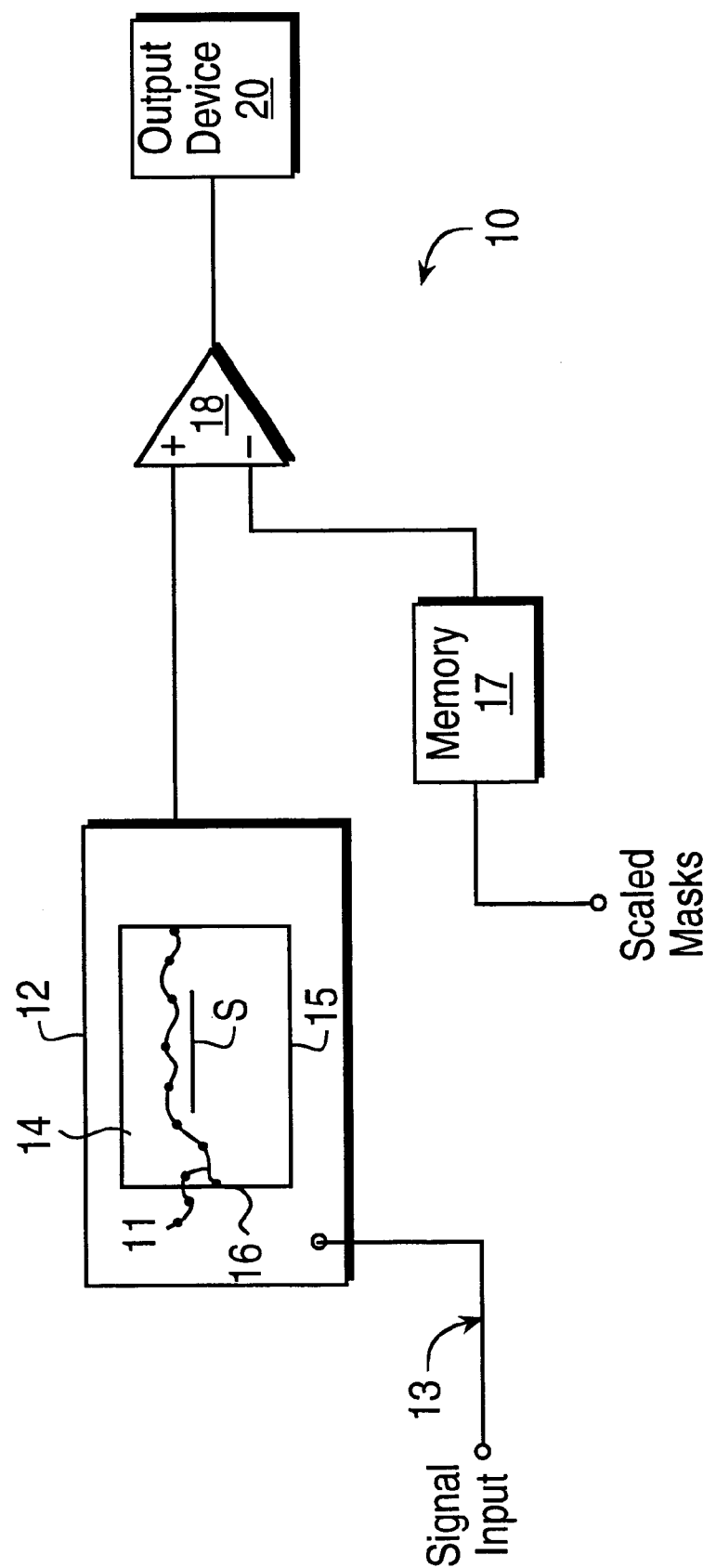
FIG. 1 shows an apparatus for determining compliance margin of a waveform, constructed according to the first preferred embodiment of the present invention.

FIG. 1 shows an apparatus 10 constructed according to a first preferred embodiment of the present invention. The apparatus 10 determines the compliance margin of a waveform 11 relative to a standard S, indicating the extent to which the waveform 11 complies or fails to comply with the standard S. A waveform acquisition system 12, within an oscilloscope, spectrum analyzer, network analyzer or other measurement instrument, captures the waveform 11 of an applied signal 13 in a display space 14. The standard S is a specification limit or a threshold represented by a point, a series of points, or other continuous or discontinuous contour in the display space 14.

The applied signal 13 is a single-valued signal, or alternatively, the applied signal 13 is a multi-valued signal, such as a pseudo-random signal present in modern electrical and optical communication systems. The captured waveform 11 includes a single record of the applied signal 13, or alternatively, the captured waveform 11 includes an accumulation of multiple records of the applied signal 13.

The apparatus 10 includes a memory 17 or other type of storage capability, either internal or external to the acquisition system 12, sufficient to store a series of scaled masks $M_1$–$M_N$ represented in the display space 14. FIGS. 2A–2D show the series of scaled masks $M_1$–$M_N$ represented in the display space 14 of various waveforms 11. Each of the scaled mask $M_1$–$M_N$ in the series is a version of the standard S that is scaled relative to the standard S according to a corresponding scale factor. The scale factors corresponding to the scaled masks $M_1$–$M_N$ are within a predefined range. In the examples shown in FIGS. 2A–2D, the scale factors include a gradient of percentages, such as scale factors at designated percentage increments, within the range of minus one hundred percent to plus one hundred percent.

Figure 2A:
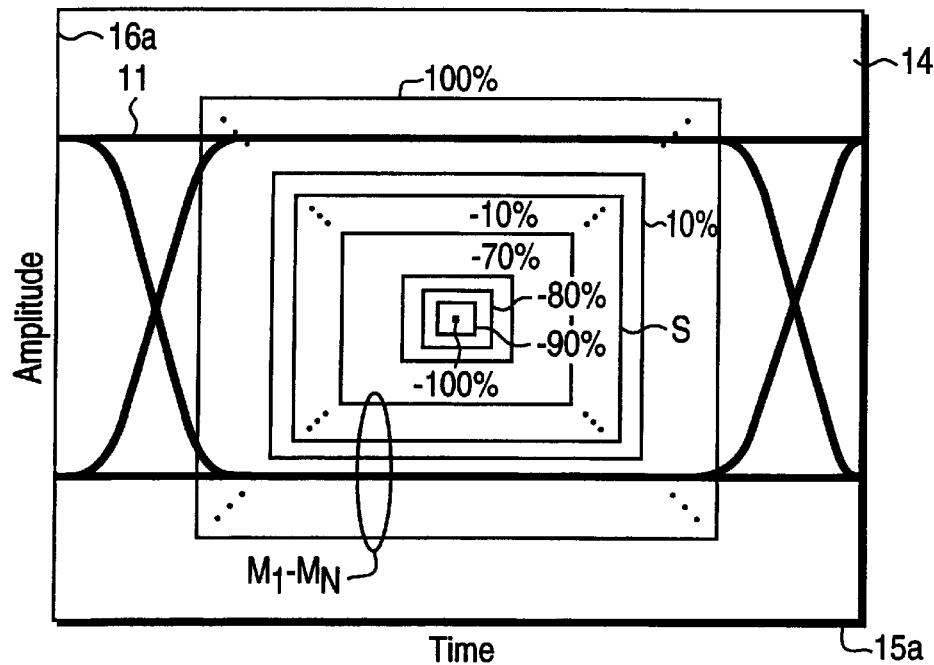
FIGS. 2A–2D show series of scaled masks represented in the display space of various waveforms according to the preferred embodiments of the present invention.
Figure 2B:
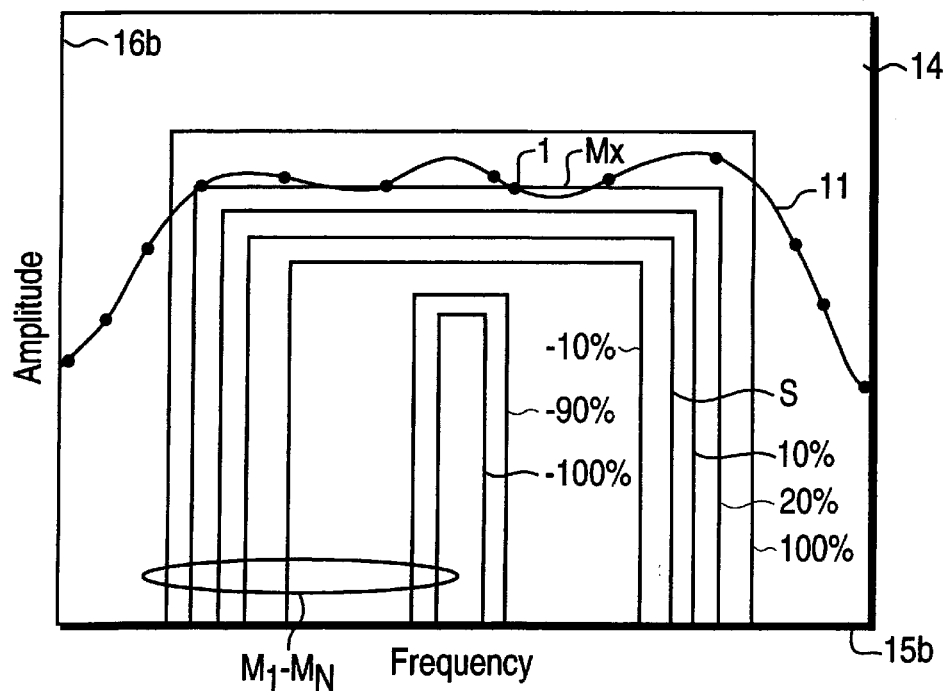
Figure 2C:
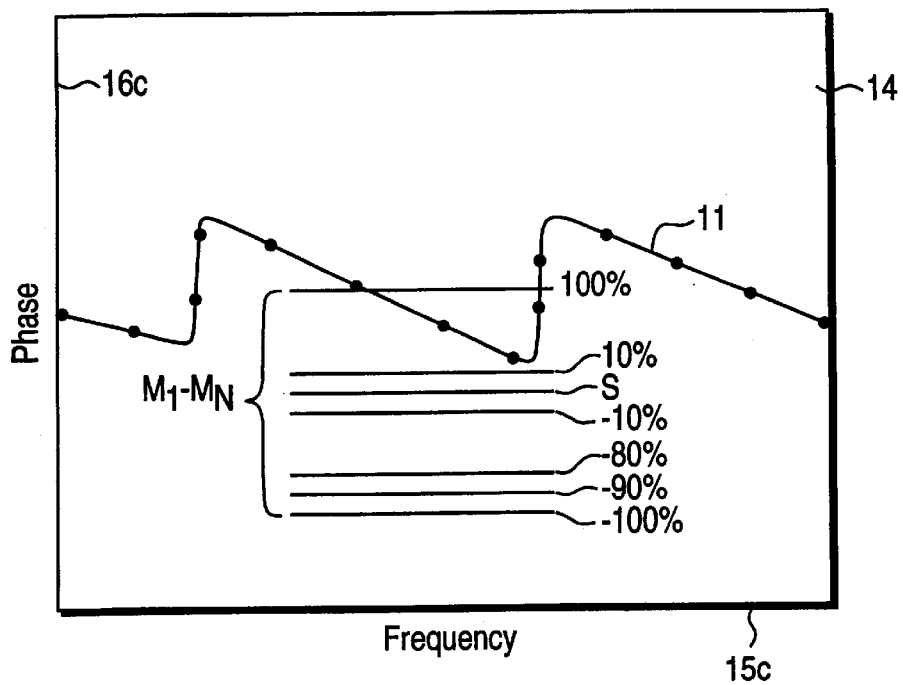
Figure 2D:
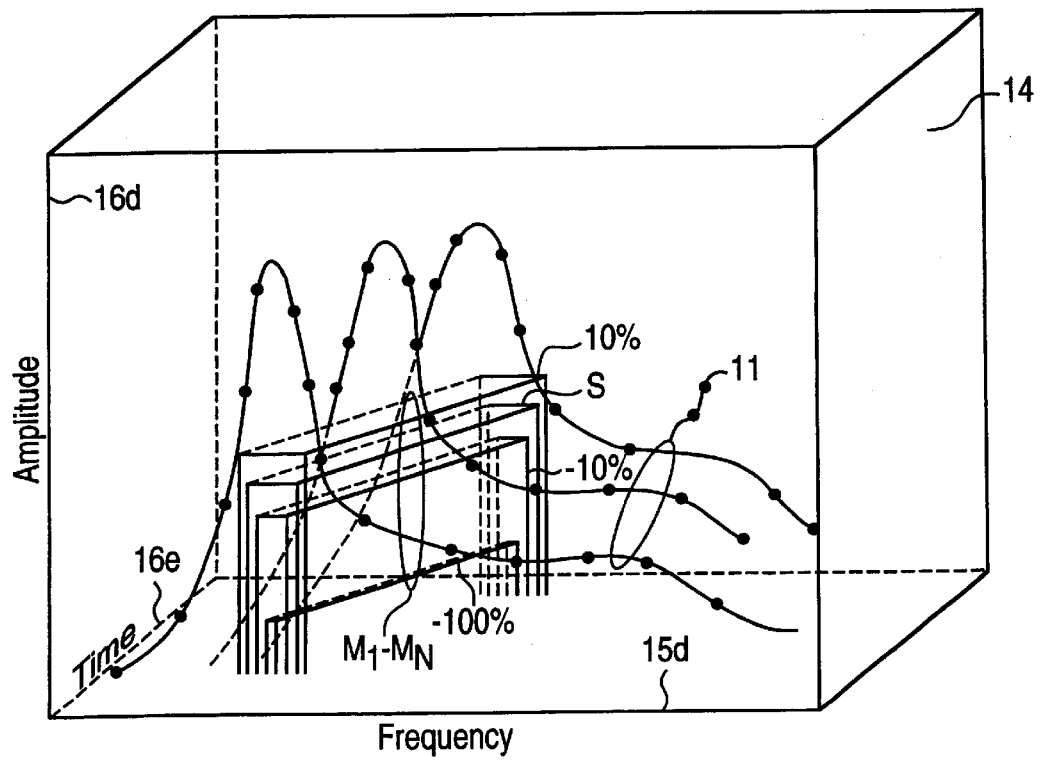

In the examples shown in FIGS. 2A–2C, the display space 14 of the waveform 11 obtained by the acquisition system 12 has two-dimensions 15, 16, wherein each of the dimensions 15, 16 represents any of a variety of designated signal parameters. In FIG. 2A, the display space 14 has an amplitude dimension 16a and a time dimension 15a, and the waveform 11 is an eye diagram representing an applied signal 13 that is multi-valued. In FIG. 2B, the display space 14 has an amplitude dimension 16b and a frequency dimension 16b, and the waveform 11 represents an applied signal 13 that is single-valued. In FIG. 2C, the display space 14 has a phase dimension 16c and a frequency dimension 15c, and the waveform 11 represents an applied signal that is single-valued.

Alternatively, the display space 14 of the captured waveform 11 can have more than two dimensions. In the example shown in FIG. 2D, the display space 14 has a time dimension 16e in addition to an amplitude dimension 16d and a frequency dimension 15d, so that spectral content of a time-variant signal 13 can be represented by the signal's waveform 11 in the display space 14. Based on the type of waveform acquisition system 12 included in the apparatus 10, the display space 14 of the waveform 11 can have dimensions and combinations of dimensions other than those shown in FIGS. 2A–2D.

In FIG. 1, the memory 17 stores the series of scaled masks $M_1-M_N$ represented in the display space 14 of the waveform 11. Typically, this storage includes a mapping of the display space 14 to elements of an array (not shown). Based on the mapping of the display space 14 to the elements of the array, the waveform 11 is represented by a series of the elements in the array, and each of the scaled masks $M_1-M_N$ is represented by a corresponding sequence of the elements in the array. The corresponding scale factor of each of the scaled masks $M_1-M_N$ is stored in the corresponding sequence of the elements in the array.

A comparator 18 compares the captured waveform 11 to the series of scaled masks $M_1-M_N$ at one or more predesignated locations in the display space 14, to determine which of the scaled masks $M_1-M_N$ in the series coincides with the waveform 11 at the one or more locations. Under condition that the display space 14 is mapped to the elements of the array, the comparator 18 identifies one or more elements in the array that are common to both the series of elements representing the waveform 11 and the sequence of elements representing each of the scaled masks $M_1-M_N$.

An output device 20, such as a monitor, printer or display screen, indicates the compliance margin of the waveform 11 based on the corresponding scale factor of the one or more scaled masks $M_1-M_N$ that coincide with the waveform 11 at the one or more locations in the display space 14. For example, at the predetermined location 1 in the display space 14 of the waveform 11 shown in FIG. 2B, the waveform 11 coincides with the scaled mask $M_X$ having a corresponding scale factor of 10. The output device 20 in this example would indicate a compliance margin of 10% at the predesignated location 1. The standard S has an equivalent scale factor of zero, and scale factors less than zero indicate non-compliance with the standard S.

Under condition that the display space 14 is mapped to the elements of the array, the output device indicates the compliance margin as a result of retrieving from the one or more elements of the array, the corresponding scale factor of the identified one or more elements. The output device 20 can indicate compliance margin of the waveform 11 relative to the standard S by displaying the corresponding scale factor of the scaled masks $M_1-M_N$ that coincide with the waveform 11 at each of the predesignated locations in the display space 14, or by displaying the lowest of the corresponding scale factors at the one or more predesignated locations. Alternatively, the output device 20 can highlight locations in the display space 14 at which the waveform 11 coincides with scaled masks having corresponding scale factors that are not high enough to comply with the standard S.

The acquisition system 12, memory 17, comparator 18 and output device 20 of apparatus 10 are suitable for being incorporated within a measurement instrument.

Figure 3:
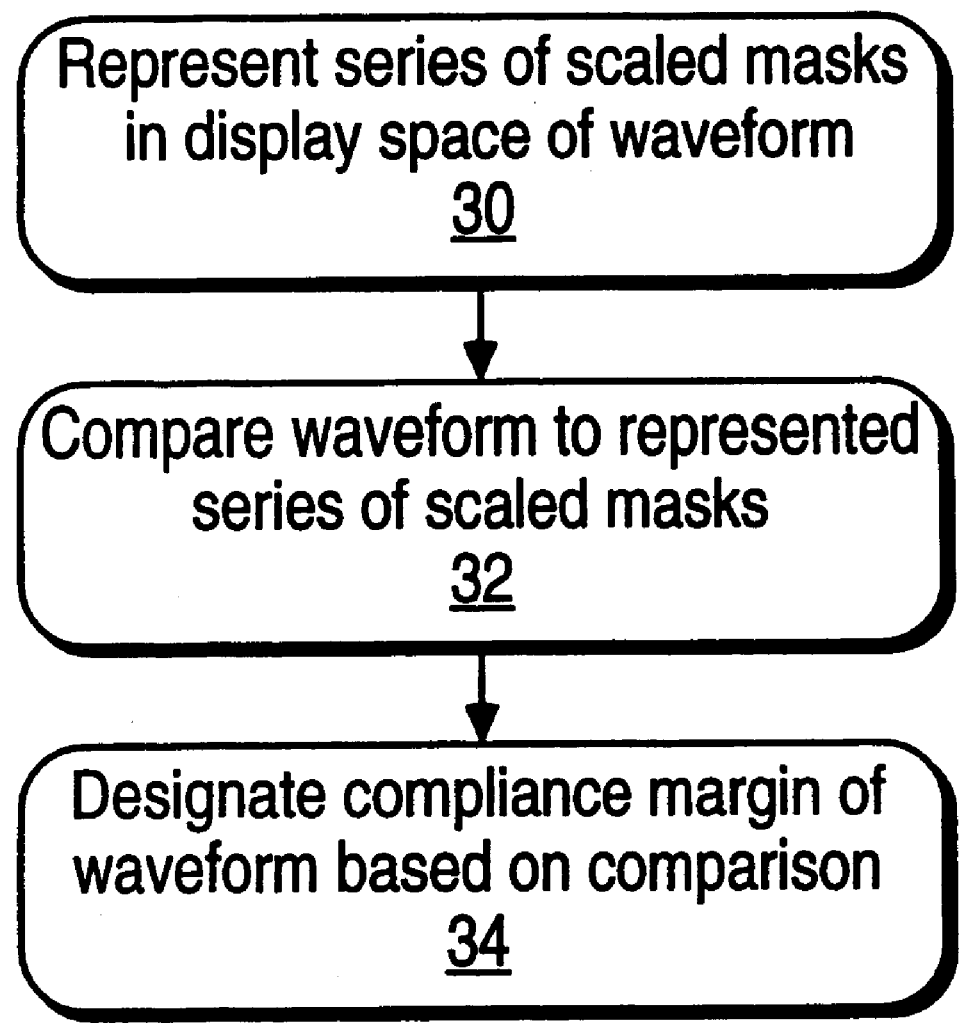
FIG. 3 is a flow diagram of a method for determining compliance margin of a waveform, constructed according to the second preferred embodiment of the present invention.

FIG. 3 is a flow diagram of a method constructed according to a second preferred embodiment of the present invention. The method includes steps 30–34 and determines the compliance margin of a captured waveform 11, indicating the extent to which the waveform 11 complies or fails to comply with the standard S. The method is suitable for implementation using the apparatus 10 shown in FIG. 1. In step 30 of the method, a series of scaled masks $M_1-M_N$ is represented in a display space 14 of the waveform 11. Each of the scaled masks $M_1-M_N$ in the series is a version of the standard S that is scaled relative to the standard S according to a corresponding scale factor within a predefined range of scale factors. FIGS. 2A–2D show the scale factors including a gradient of percentages within the range of minus one hundred percent to plus one hundred percent.

Typically step 30 includes mapping the display space 14 to elements of an array. Based on this mapping, the waveform 11 is represented by a series of the elements in the array, and each of the scaled masks $M_1-M_N$ is represented by a corresponding sequence of the elements in the array. The corresponding scale factor of each of the scaled masks $M_1-M_N$ is stored in the corresponding sequence of the elements in the array.

In step 32, the waveform 11 is compared to the represented series of scaled masks $M_1-M_N$ at one or more predesignated locations in the display space 14 to determine which of the scaled masks $M_1-M_N$ in the series coincides with the waveform 11 at the one or more locations. Under condition that the display space 14 is mapped to the elements of the array in step 30, the comparison identifies one or more elements in the array that are common to both the series of elements representing the waveform 11 and the sequence of elements representing each of the scaled masks $M_1-M_N$.

In step 34, the compliance margin of the waveform 14 is designated according to the corresponding scale factor of the one or more scaled masks $M_1-M_N$ in the series that coincide with the waveform 11 at the one or more locations in the display space 14. Under condition that the display space 14 is mapped to the elements of the array, the compliance margin results from retrieving from the one or more elements of the array, the corresponding scale factor of the identified one or more elements. The compliance margin of the waveform 11 is designated by displaying the corresponding scale factor of the scaled masks $M_1-M_N$ that coincide with the waveform 11 at each of the predesignated locations in the display space 14, or by displaying the lowest of the corresponding scale factors at the one or more predesignated locations. Alternatively, the compliance margin is designated by highlighting locations in the display space 14 at which the waveform 11 coincides with scaled masks having corresponding scale factors that are not high enough to comply with the standard S.

While the preferred embodiments of the present invention have been illustrated in detail, it should be apparent that modifications and adaptations to these embodiments may occur to one skilled in the art without departing from the scope of the present invention as set forth in the following claims.

What is claimed is:

1. An apparatus for determining compliance margin of a waveform relative to a standard, comprising:

an acquisition system capturing the waveform by obtaining multiple records of an applied signal in a display space;

a memory storing a series of scaled masks represented in the display space, each scaled mask in the series being scaled relative to the standard according to a corresponding scale factor within a predefined range of scale factors;

a comparator determining which of the scaled masks in the series coincides with the waveform at at least one predesignated location in the display space based on comparison of the waveform to the represented series of scaled masks at the at least one predesignated location in the display space;

an output device indicating the compliance margin of the waveform based on the corresponding scale factor of the one of the scaled masks in the series that coincides with the waveform at the at least one predesignated location in the display space.

2. The apparatus of claim 1 wherein storing the series of scaled masks represented in the display space includes a mapping of the display space to elements of an array, wherein the waveform is represented by a series of the elements in the array, each of the scaled masks is represented by a corresponding sequence of the elements in the array, and the corresponding scale factor of each scaled mask is stored in the corresponding sequence of the elements.

3. The apparatus of claim 2 wherein the comparator compares the waveform to the represented series of scaled masks at the at least one predesignated location in the display space by identifying at least one element in the array that is common to the series of elements representing the waveform and the sequence of elements representing each of the scaled masks.

4. The apparatus of claim 3 wherein the output device designates the compliance margin by retrieving from the array, the corresponding scale factor of the identified at least one element in the array.

5. The apparatus of claim 1 wherein the display space has at least an amplitude dimension and a frequency dimension.

6. A method for determining compliance margin of a waveform relative to a standard, comprising:

representing a series of scaled masks in a display space of the waveform, each scaled mask in the series being scaled relative to the standard according to a corresponding scale factor within a predefined range of scale factors, wherein representing the series of scaled masks includes mapping the display space of the waveform to elements of an array, representing the waveform as a series of the elements in the array, representing each of the scaled masks according to a corresponding sequence of the elements in the array, and storing the corresponding scale factor of each scaled mask in the corresponding sequence of the elements comparing, at least one predesignated location in the display space, the waveform to the represented series of scaled masks to determine which of the scaled masks in the series coincides with the waveform at the at least one predesignated location in the display space; and designating the compliance of the waveform to the standard based on the corresponding scale factor of the one of the scaled masks in the series that coincides with the waveform at the at least one predesignated location in the display space.

7. The method of claim 6 wherein comparing, at the at least one predesignated location in the display space the waveform to the represented series of scaled masks, includes identifying at least one element in the array that is common to the series of elements representing the waveform and the sequence of elements representing each of the scaled masks.

8. The method of claim 7 wherein designating the compliance margin includes retrieving from the array, the corresponding scale factor of the identified at least one element in the array.

9. The method of claim 6 wherein the display space has at least an amplitude dimension and a frequency dimension.

10. The method of claim 6 wherein the waveform includes multiple records of an applied signal.

* * * * *